United States Patent [19]

Hagiwara et al.

[11] Patent Number: 4,591,754
[45] Date of Patent: May 27, 1986

[54] ELECTRON GUN FOR BRIGHTNESS

[75] Inventors: Hirotoshi Hagiwara; Hideo Hiraoka; Masaji Ishii, all of Tokyo, Japan

[73] Assignee: Denki Kagaku Kogyo Kabushiki Kaisha, Tokyo, Japan

[21] Appl. No.: 724,948

[22] Filed: Apr. 22, 1985

Related U.S. Application Data

[63] Continuation of Ser. No. 604,420, Apr. 30, 1984, abandoned, and a continuation of Ser. No. 330,458, Dec. 14, 1981.

[30] Foreign Application Priority Data

Dec. 27, 1980 [JP] Japan .................. 55-185518

[51] Int. Cl.$^4$ .................. H01J 1/16; H01J 19/10
[52] U.S. Cl. .................. 313/336; 313/346 R
[58] Field of Search .................. 313/336, 346 R, 310, 313/311

[56] References Cited

U.S. PATENT DOCUMENTS 4,054,946 10/1977 Ferris et al. .................. 313/346 R
4,055,780 10/1977 Kawai et al. .................. 313/346 R

FOREIGN PATENT DOCUMENTS 2049270 12/1980 United Kingdom .

OTHER PUBLICATIONS

Introduction to Electron Beam Technology, Ed. by R. Bakish (Wiley, 1962) p. 270.
Electron and Ion Beam Science and Technology (Proceedings of the First International Conference), Ed. by R. Bakish (Wiley, 1965) p. 119.
A Pierce Description of the Travelling Wave Gyrotron, by A. J. Sangster (Vacuum, Nov./Dec. 1980, vol. 30, p. 466).
Energy Distribution, Intensity Modulation and Emittance of the Beam Extracted from a Duopigatron Source, by J. P. Grandchamp, et al (Vacuum, Jan./Feb. 1984, vol. 34, p. 68).
Japanese Journal of Applied Physics, Letters, Bd. 19, 1980, Nr. 9, S.L537-L540.

Primary Examiner—William L. Sikes
Assistant Examiner—Robert E. Wise
Attorney, Agent, or Firm—Oblon, Fisher, Spivak, McClelland & Maier

[57] ABSTRACT

An electron gun for high brightness including a $LaB_6$ single crystal cathode having a (100) plane on at least part of a main electron beam emission surface of a cathode tip having a top and a Wehnelt having a tapered surface defining an interior angle similar to or greater than a vertical angle of said cathode tip.

8 Claims, 8 Drawing Figures

F I G. 1
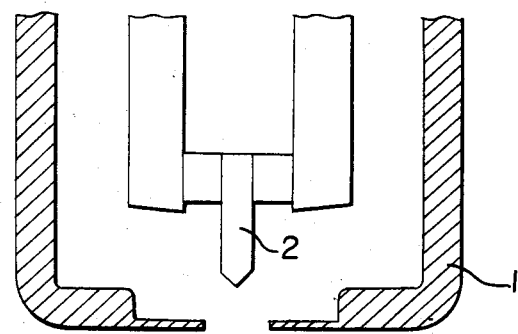
F I G. 3
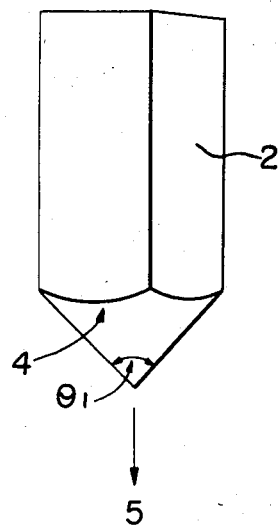
F I G. 4
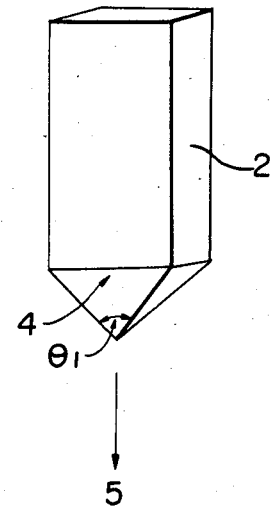

ACCELERATION VOLTAGE 20KV SINGLE CRYSTAL $LaB_6$ CATHODE TIP
CONICAL ANGLE 90° CURVATURE 15 μm RADIUS

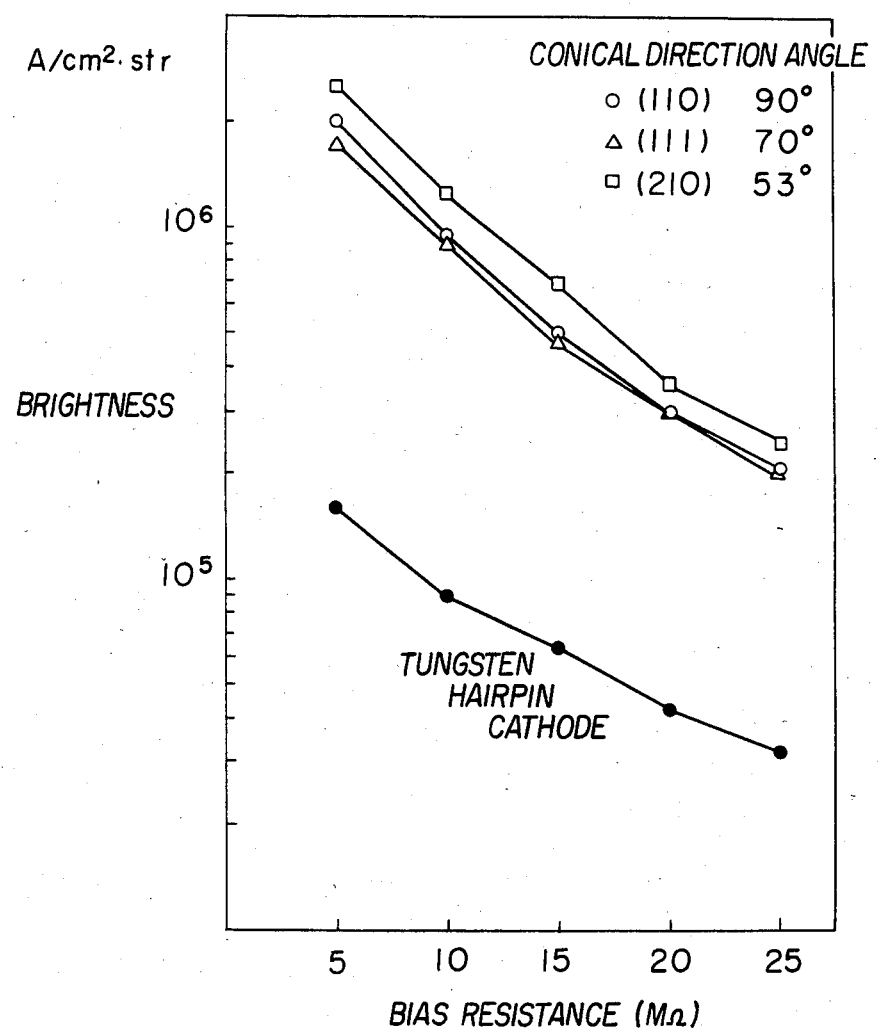
F I G. 5
ACCELERATION VOLTAGE 20KV

ELECTRON GUN FOR BRIGHTNESS

This application is a continuation of application Ser. No. 604,420, filed Apr. 30, 1984 now abandoned. This application is a continuation of application Ser. No. 330,468, filed Dec. 14, 1981.

BACKGROUND OF THE INVENTION:

1. Field of the invention

The present invention relates to an electron gun for high brightness in which a lanthanum hexaboride ($LaB_6$) single crystal is used.

2. Description of the Prior Art

The thermionic electron emission cathode made of a $LaB_6$ single crystal (hereinafter referring to as a $LaB_6$ single crystal cathode) exhibits high brightness, long life and excellent electron beam stability and accordingly, it is practically used as a cathode of an electron gun for electron beam applied instruments such as a scanning type electron microscope and an electron beam exposure instrument.

The $LaB_6$ single crystal cathode has a higher purity of the cathode source in comparison with the sintered $LaB_6$ cathode. Moreover, it has a smooth surface whereby the stability of the electron beam is especially superior to be able to limit variations of the electron beam to 1%/hr. or less. However, prior efforts have not succeeded in developing an electron gun having a $LaB_6$ single crystal cathode which maintains high brightness for a long time. Thus, there is a need to obtain a $LaB_6$ single crystal cathode having excellent brightness and long life as well as a high-stability electron beam.

$LaB_6$ single crystal cathodes having each $<100>$, $<110>$ or $<111>$ direction as the axial direction of the cathode have been respectively studied and brightnesses thereof have been measured by many researchers to satisfy the requirement as disclosed in F. J. Hohn, T. H. P. Chang, A. N. Broers, "Comparative measurements on the High Brightness $LaB_6$ Electron Gun using Sintered and Single Crystal Cathodes Materials", Proc. Microcircuit Engineering, 79 Aachen 31, and Takigawa, Yoshii, Sasaki, Motoyama and Meguro, "Emission Characteristics for $<100>$ $<110>$ and $<111>$ $LaB_6$ Cathodes", Japanese Journal of Applied Physics. 19(9) 557-540 1980.

In the prior art, it is reported that the brightness of the $LaB_6$ single crystal cathode having a $<100>$ direction is the highest and the brightness of the $LaB_6$ single crystal cathode having a $<110>$ direction is inferior and that of a $<111>$ direction is further inferior.

The inventors have determined that the electron gun having a $LaB_6$ single crystal cathode having a $<100>$ direction imparts brightness by 10 times or more of the brightness of tungsten (W) hair pin cathode at the initiation, however, the brightness decreases over time to decrease to about 2 times of that of the tungsten hair pin cathode.

On the other hand, when a single crystal cathode having a $<110>$ direction or a $<111>$ direction is used in an electron gun in the combination of the flat (conventional) Wehnelt shown in FIG. 1, a satisfactory brightness could not be given from the initiation as shown in FIG. 2.

SUMMARY OF THE INVENTION

It is an object of the present invention to provide an electron gun which has excellent electron beam stability at a variation of 1%/hr. or less and maintains high brightness for a long time.

Another object of the present invention is to provide an electron gun having high brightness, long life and high stability, which are required for a $LaB_6$ single crystal cathode, by a combination of a structure of Wehnelt and a crystallographic plane for easiest electron emission on not only an axial direction of the single crystal cathode but also on a cathode tip.

The foregoing and other objects of the present invention have been attained by providing an electron gun for high brightness which comprises a $LaB_6$ single crystal cathode having a tip including a main electrode emission surface, the cathode tip having a (100) plane on at least a part of this main emission surface, and a Wehnelt having an interior surface facing the cathode tip and defining an interior angle similar to or more than a vertical angle defined by the cathode tip.

BRIEF DESCRIPTION OF THE DRAWINGS

FIG. 1 is a vertical sectional view of an electron gun cathode with the conventional (flat) Wehnelt;

FIGS. 3 and 4 are schematic views of cathode tips;

FIG. 5 is a graph of brightnesses of the electron gun of the present invention in the case of the convex Wehnelt;

DETAILED DESCRIPTION OF THE PREFERRED EMBODIMENTS

Figure 7:
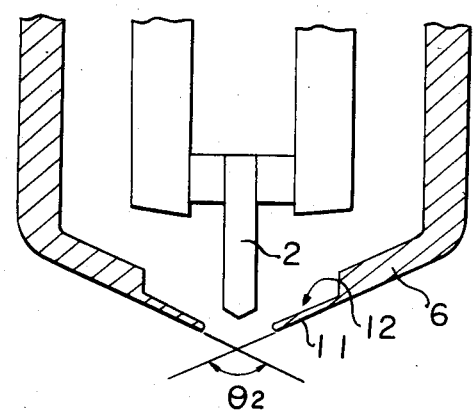
FIGS. 7 and 8 are respectively vertical sectional views of the convex Wehnelt used for the electron gun of the present invention.
Figure 8:
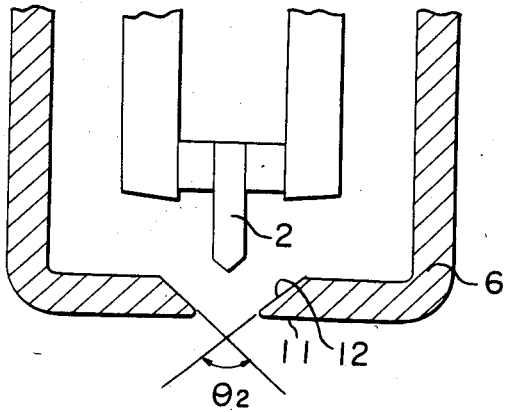

The present invention is to provide an electron gun for high brightness which comprises a $LaB_6$ single crystal cathode having a (100) plane on at least part of the main electron emission planes of a cathode tip having a top and a convex Wehnelt shown in FIGS. 7 and 8. The electron gun imparts brightness by 10 times or more of the brightness by a tungsten hair pin cathode, for 1000 hours or longer.

The present invention will be further illustrated by examples.

In the present invention, the cathode tip having a top can have a conical shape shown in FIG. 3 or a pyramidal shape shown in FIG. 4.

It has been considered that the electron beam is emitted from only the sharp top of the cathode tip.

In the conventional $LaB_6$ electron gun, only the electron beam emitted from the sharp top has been substantially used in practice at high bias voltage applied to the Wehnelt.

Even though the $LaB_6$ single cathode tip has a conical form, the conical form of the top is gradually changed into a pyramid form from the edge of the top by heating. When the (100) plan, of the cathode crystal is exposed at the pyramidal surface of the cathode tip, it is stabilized. Therefore, in the electron gun having the structure for emission of electron beam only from the top of the cathode tip as the conventional electron gun, when the top is changed into pyramidal form during the heating, the electron beam emission area is reduced and the electric field around the cathode tip is changed by effects of an anode and Wehnelt to reduce electron beam emission whereby the brightness is remarkably lowered.

EXAMPLE 1

A LaB$_6$ single crystal cathode having a cathode tip shown in FIG. 3 having a conical vertical angle of 90 degree at a <110> direction (5), a conical vertical angle of 70 degree at a <111> direction and a conical vertical angle of 53 degree at a <210> direction was used and a convex Wehnelt shown in FIG. 7 was placed between the cathode and an anode. The electron beam emitted from the (100) planes formed mainly on the conical surface (4) of the cathode tip had large current density and formed a crossover having a small diameter whereby the brightness was more than 10 times of the brightness given by the tungsten hair pin cathode as shown in FIG. 5.

The form of the cathode tip was changed into a pyramid form during heating. Thus, the (100) planes were formed on the pyramid surfaces and accordingly the current density and the diameter of the crossover were not substantially changed whereby the brightness was not substantially changed.

In the case of a constant cathode temperature of 1550° C. and a vacuum degree of the electron gun of $8 \times 10^{-8}$ Torr, the brightness of more than 10 times of the tungsten hair pin cathode could be maintained for longer than 1000 hours.

The axial direction and a conical vertical angle of the cathode tip used in the present invention can be calculated from an angle of the crystalline face in the desired axial direction to the (100) plane since LaB$_6$ crystal is in cubic crytalline system.

The cathode tip used in the present invention can have a pyramid form if the (100) plane is given on at least one surface.

The typical example of the cathode tip used in the present invention, is a pyramidal cathode tip in which the axial direction (5) is the (111) crystallographic direction, and in which three pyramidal surfaces (4) forming the pyramidal cathode tip are the (100) planes of the cathode crystal.

The purpose of the present invention is also attained by using a cathode tip having a conical surface on which the (100) plane is not formed if the pyramidal surfaces having (100) planes are formed by heating in use. One example is a cathode tip having a conical surface in the <111> direction and a conical vertical angle ranging from 60 to 90 degree.

Figure 2:
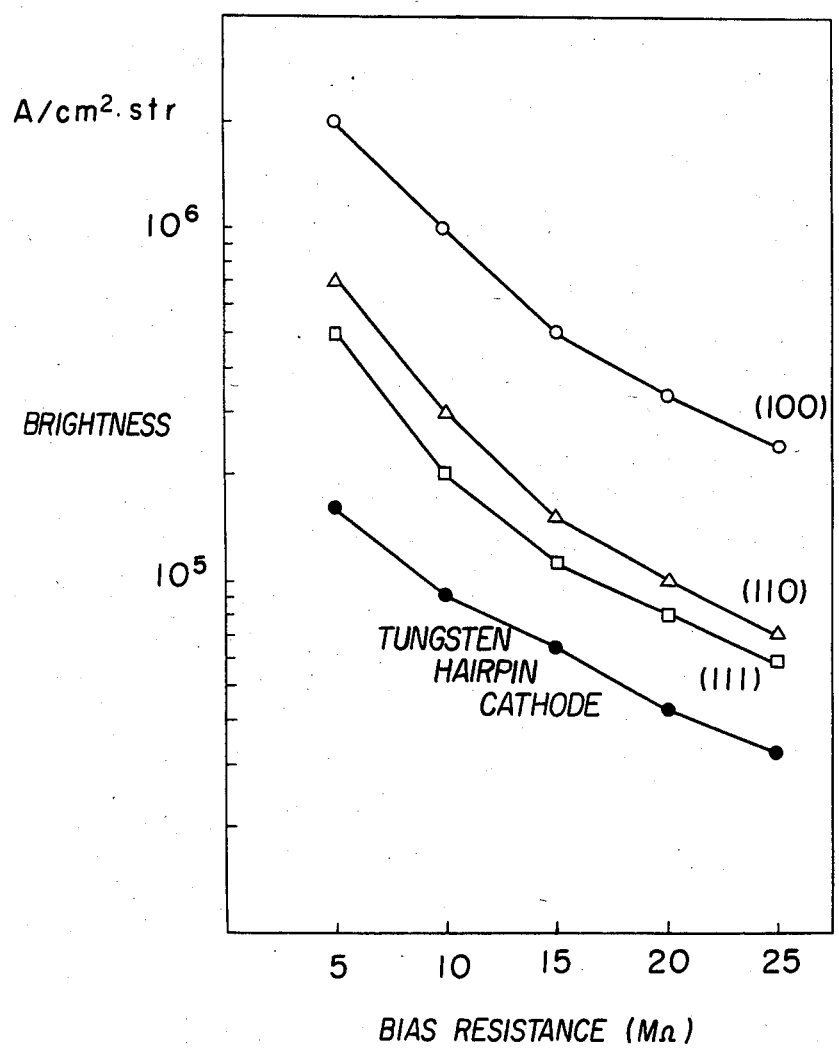
FIG. 2 is a graph of brightnesses based on axial directions of $LaB_6$ single crystal cathodes in the case of a flat Wehnelt.
Figure 6:
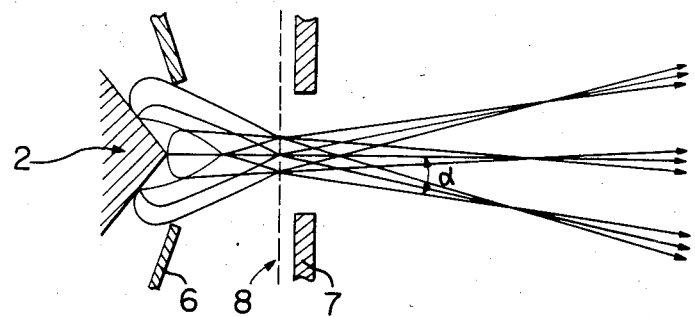
FIG. 6 is a schematic view of the orbit of electron beam.

FIG. 6 is a schematic view for showing the effect of orbits of the electron beam emitted from the (100) planes on the conical or pyramid surface of the cathode tip by difference of the electric field formed by the Wehnelt.

In accordance with the present invention, the convex Wehnelt is used whereby the crossover (8) formed by the electron beam emitted from the (100) planes on the conical surface or the pyramid surfaces of the cathode tip has a smaller diameter and the divergence angle α of the electron beam from the crossover is smaller. On the other hand, when a conventional flat Wehnelt of the type as shown in FIG. 1 is used, the diameter of the crossover and the divergence angle α of the electron beam are larger than the crossover diameter and divergence angle α experienced when a convex Wehnelt is used. Thus it is understood that the brightness β given by the equation (1) in the case of the convex Wehnelt is greater than that of the flat Wehnelt shown in FIG. 1.

$$\beta = [I/\pi^2 \gamma^2 \alpha^2)] \quad (1)$$

wherein I: a current of the electron beam; γ: a diameter of the crossover; and α: divergence angle of the electron beam.

In the shape of the convex Wehnelt for reducing a diameter of the crossover and a divergence angle of the electron beam, in view of the electric field near the cathode tip, when the vertical angle ($\theta_1$) of the top of the cathode tip is 90 degree, the conical vertical angle ($\theta_2$) of the convex Wehnelt shown in FIG. 7 is preferably 90 degree. If a part of a support member of the cathode may contact Wehnelt, the convex Wehnelt can have a conical vertical angle of 160 degree or less.

In the convex Wehnelt used in the present invention, an outer wall (11) of the Wehnelt is not always necessarily in parallel to an inner wall (12), but the angle $\theta_2$ of the tapered surfaces of the inner wall (12) is similar or more than the vertical angle ($\theta_1$) of the cathode tip.

Therefore, the convex Wehnelt can have the structure shown in FIG. 8 wherein the inner wall (12) of the Wehnelt has a tapered surface at an interior angle similar to the vertical angle of the tip, but the outer wall has not an exterior angle.

We claim:

1. An electron gun for high brightness, comprising:
   a LaB$_6$ single crystal cathode having a (100) plane on at least part of a main electron beam emission surface of a cathode tip, and
   a Wehnelt having a tapered surface defining an interior vertical angle ($\theta_2$) similar to or more than a vertical angle ($\theta_1$) of said cathode tip.

2. The electron gun according to claim 1, wherein the interior angle ($\theta_2$) of said Wehnelt is substantially the same as the vertical angle ($\theta_1$) of said cathode tip.

3. The electron gun according to claim 1, comprising:
   a conical cathode tip having a crystal axis direction of (110) and a conical vertical angle ($\theta_1$) of 90 degrees, and a conical Wehnelt.

4. The electron gun according to claim 1, comprising:
   P1 a conical cathode tip having a crystal axis direction of (111) and a conical vertical angle ($\theta_1$) ranging from 60 to 90 degrees, and a conical Wehnelt.

5. The electron gun according to claim 1, comprising:
   a conical cathode tip having a crystal axis direction of (210) and a conical vertical angle ($\theta_1$) of 53 degrees, and a conical Wehnelt.

6. The electron gun according to claim 1, comprising:
   a pyramidal cathode tip having a crystal axis direction of (111) and surrounded by three (100) planes, and a conical Wehnelt.

7. The electron gun according to claim 1, comprising:
   said interior vertical angle ($\theta_2$) of said Wehnelt being equal to or less than 160 degrees.

8. The electron gun according to claim 7, comprising:
   said interior vertical angle ($\theta_2$) being conical.

* * * * *